(12) United States Patent
Ishii

(10) Patent No.: US 9,324,750 B2
(45) Date of Patent: Apr. 26, 2016

(54) IMAGING DEVICE AND IMAGING APPARATUS

(75) Inventor: Shunsuke Ishii, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 653 days.

(21) Appl. No.: 13/530,996

(22) Filed: Jun. 22, 2012

(65) Prior Publication Data

US 2013/0009038 A1    Jan. 10, 2013

(30) Foreign Application Priority Data

Jul. 4, 2011  (JP) .................................. 2011-147932

(51) Int. Cl.
| | |
|---|---|
| *H01L 27/00* | (2006.01) |
| *H01L 27/146* | (2006.01) |
| *H04N 5/355* | (2011.01) |
| *H04N 5/369* | (2011.01) |
| *H04N 5/232* | (2006.01) |

(52) U.S. Cl.
CPC .... *H01L 27/14623* (2013.01); *H01L 27/14607* (2013.01); *H04N 5/35563* (2013.01); *H04N 5/3696* (2013.01); *H01L 27/14636* (2013.01); *H01L 27/14643* (2013.01); *H04N 5/23216* (2013.01)

(58) Field of Classification Search
CPC ............ H01L 23/585; H01L 27/14603; H01L 27/14605; H01L 27/14607; H01L 27/14636; H01L 27/14643; H01L 27/14623; G02F 1/38; G03F 1/136286; G03F 1/38; H04N 5/23216; H04N 5/3696; H04N 5/35563
USPC ......... 250/208.1; 257/239; 348/245–247, 275
See application file for complete search history.

(56) References Cited

U.S. PATENT DOCUMENTS

| | | | | |
|---|---|---|---|---|
| 8,253,174 | B2 * | 8/2012 | Daniel et al. ................... | 257/210 |
| 2002/0122130 | A1 * | 9/2002 | Yamaguchi ....... | H01L 27/14603 |
| | | | | 348/308 |
| 2004/0113151 | A1 * | 6/2004 | Sekine ............... | 257/72 |
| 2007/0064133 | A1 * | 3/2007 | Shizuishi .......... | H01L 27/14623 |
| | | | | 348/308 |
| 2008/0218608 | A1 * | 9/2008 | Rossi et al. ..................... | 348/243 |
| 2011/0175981 | A1 * | 7/2011 | Lai et al. .......................... | 348/46 |
| 2013/0049156 | A1 * | 2/2013 | Furukawa ........... | H01L 27/1461 |
| | | | | 257/443 |

FOREIGN PATENT DOCUMENTS

| | | |
|---|---|---|
| JP | 2005-223707 | 8/2005 |
| JP | 2010-141093 | 6/2010 |

* cited by examiner

*Primary Examiner* — Georgia Y Epps
*Assistant Examiner* — Kevin Wyatt
(74) *Attorney, Agent, or Firm* — Hazuki International, LLC

(57) ABSTRACT

Disclosed herein is an imaging device including at least one special pixel with a configuration having a layout made different from the layout of the configuration of each pixel other than the special pixel. The special pixel is a pixel having an imaging characteristic steadily different from that of the other pixels. A difference in layout between the configuration of the special pixel and the configuration of the other pixels is used to suppress a non-uniformity of the imaging characteristic exhibited by the special pixel.

21 Claims, 16 Drawing Sheets

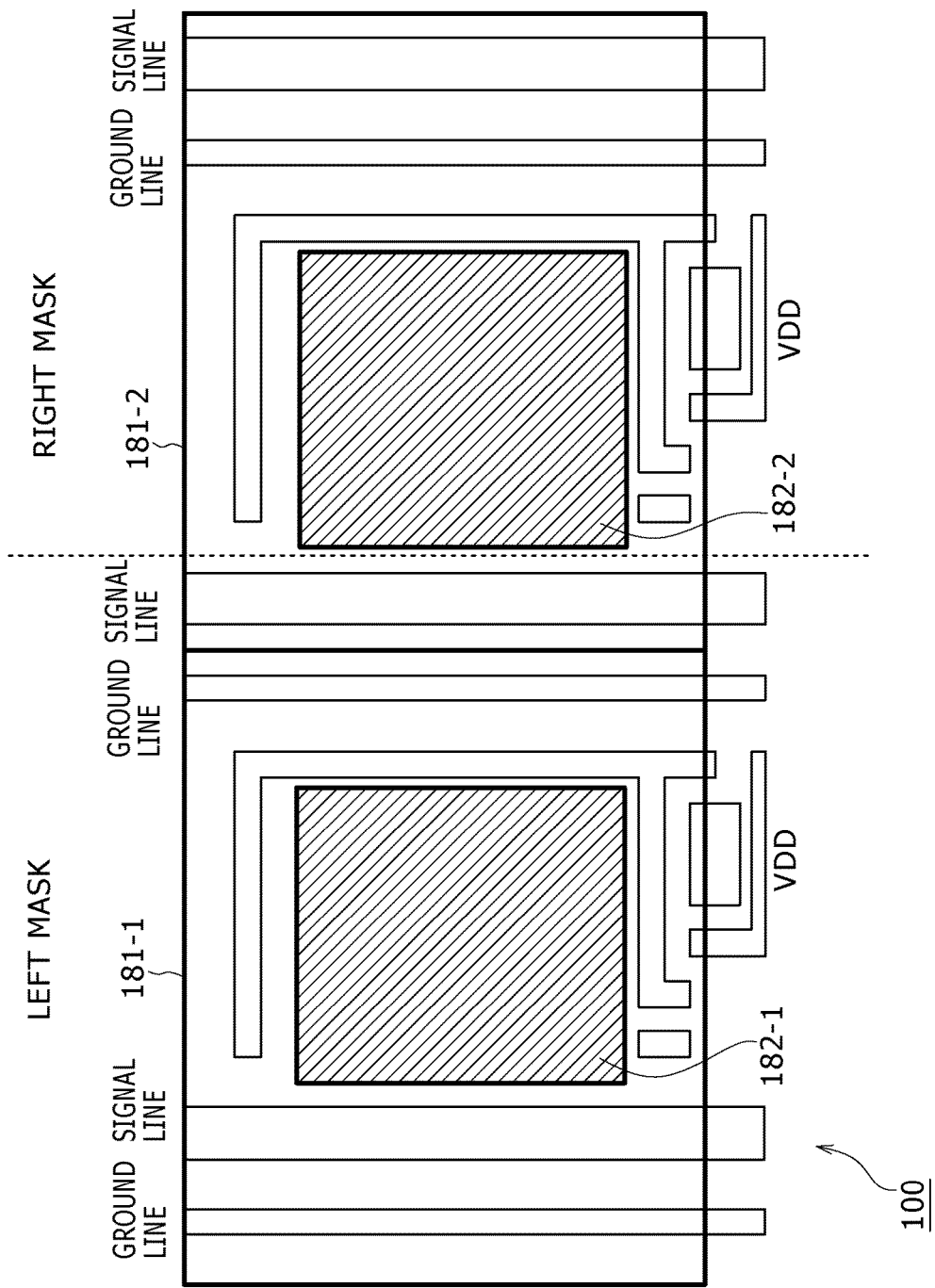

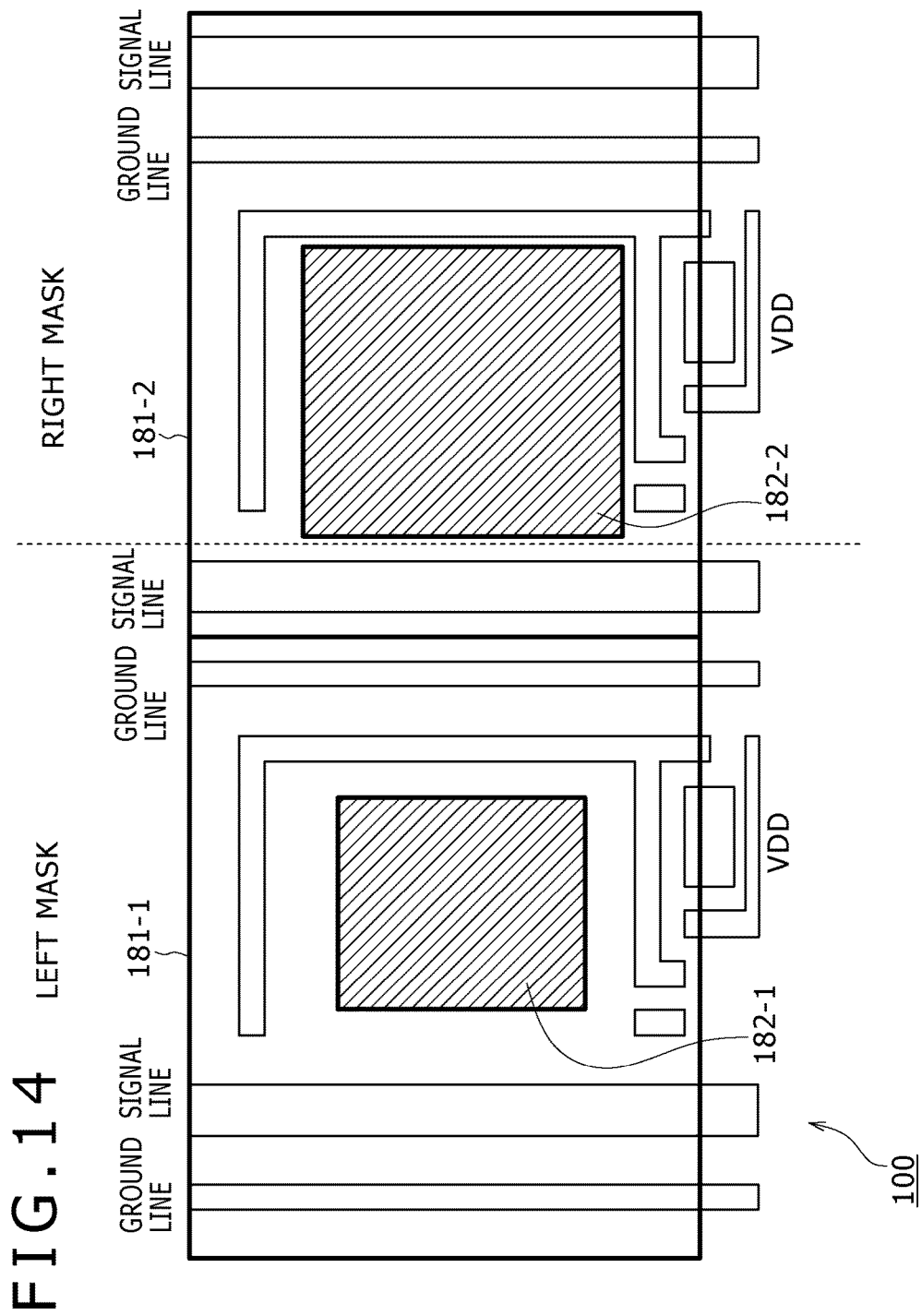

IMAGING DEVICE AND IMAGING APPARATUS

BACKGROUND

In general, the present disclosure relates to an imaging device and an imaging apparatus. More particularly, the present disclosure relates to an imaging device capable of suppressing local non-uniformities of the imaging characteristic of the imaging device, and an imaging apparatus employing the device.

In recent years, improvements of the manufacturing technologies of semiconductors allow progress to be made in semiconductor-device miniaturization and the sizes of semiconductor-device chips to be increased. In addition, the sizes of masked circuits are also raised as well. For example, the number of pixels included in an imaging device masked in one chip increases. A typical example of such an imaging device is a CMOS (Complementary Metal Oxide Semiconductor) image sensor.

In a CMOS image sensor having a large chip size as is the case with a 35 mm-size sensor for example, due to apparatus restrictions, the entire chip cannot be exposed at one time. If infinitesimal devices should be created all over the large area of the CMOS image sensor in a device creation process, conceivably, the area is to be divided into a plurality of sub-areas in every of which the devices can be created once. Then, the sub-areas are joined to each other in order to create the large area of the CMOS image sensor. This method for creating such a CMOS image sensor having a large area is referred to as an area division/concatenation method. For example, Japanese Patent Laid-open No. 2005-223707 proposes the use of a technology referred to as a division exposure technique for creating a large solid-state imaging device.

As described above, however, if the division exposure technique is adopted, the adjustment shift of a portion on the right-hand side of an exposure boundary line is different from the adjustment shift of a portion on the left-hand side of the exposure boundary line. As a result, the characteristic of the portion on the right-hand side of the exposure boundary line is also different from the characteristic of the portion on the left-hand side of the exposure boundary line. If the difference in characteristic changes gradually, no big problem is raised. If left and right exposure processes are carried out, however, this boundary is created on a straight line, resulting in a distinct difference in characteristic. Thus, a clear difference in characteristic between the right and left portions on both the sides of the boundary line is noticeably observed.

In the case of a solid-state imaging device for example, this boundary is created on a straight line, giving rise to a clear difference in characteristic. In this case, an output difference between the right and left portions on both the sides of the boundary line is visibly recognized as a luminance line or a black line so that the boundary becomes striking.

In order to solve the problem described above, there has been devised a method disclosed in documents such as Japanese Patent Laid-open No. 2010-141093. In accordance with this method, a device portion simultaneously created in a specific process is mixed with a device portion simultaneously created in another process. In the specific process, exposure processing and ion injection are carried out for a specific sub-area whereas, in the other process, the exposure processing and the ion injection are carried out for the other sub-area.

SUMMARY

However, solutions methods other than the method disclosed in Japanese Patent Laid-open No. 2010-141093 are also demanded.

The present disclosure has been made in order to solve the problems described above to suppress local non-uniformities of an imaging characteristic.

In accordance with an embodiment of the present disclosure, there is provided an imaging device including at least one special pixel with a configuration having a layout made different from the layout of the configuration of each pixel other than the special pixel.

The special pixel is a pixel having an imaging characteristic steadily different from that for each of the other pixels and a difference in layout between the configuration of the special pixel and the configuration of each of the other pixels can be used to suppress a non-uniformity of the imaging characteristic exhibited by the special pixel.

The special pixel can be a pixel in the vicinity of a joint between masks.

The special pixel can be a pixel in which an AL (aluminum) line has a shape made different from that for each of the other pixels.

The special pixel can be a pixel in which an AL line is made thicker than that for each of the other pixels.

The special pixel can be a pixel in which an AL line is made thinner than that for each of the other pixels.

The AL line can be a line of a floating diffusion section.

The special pixel can be a pixel in which an AL line is provided at a location different from that for each of the other pixels.

The special pixel can be a pixel in which the gap between AL lines adjacent to each other is made smaller than that for each of the other pixels.

The special pixel can be a pixel in which the gap between AL lines adjacent to each other is made larger than that for each of the other pixels.

The AL lines can be a line of a floating diffusion section and a ground line.

The special pixel can be a pixel in which the size of a read gate is made different from that for each of the other pixels.

The special pixel can be a pixel in which the size of a read gate is made larger than that for each of the other pixels.

The special pixel can be a pixel in which the size of a read gate is made smaller than that for each of the other pixels.

The special pixel can be a pixel in which a floating-diffusion-section creation implant pattern is made different from that for each of the other pixels.

The special pixel can be a pixel in which the size of an aperture is made different from that for each of the other pixels.

The special pixel can be a pixel in which the size of an aperture is made smaller that for each of the other pixels.

The special pixel can be a pixel in which the size of an aperture is made larger than that for each of the other pixels.

In accordance with another embodiment of the present disclosure, there is provided an imaging apparatus including an imaging device including one special pixel with a configuration having a layout made different from the layout of the configuration of each pixel other than the special pixel.

In accordance with a further embodiment of the present disclosure, there are provided at least one special pixel with a configuration having a layout made different from the layout of the configuration of each pixel other than the special pixel.

In accordance with a still further embodiment of the present disclosure, there is provided an imaging device including at least one special pixel with a configuration having a layout made different from the layout of the configuration of each pixel other than the special pixel.

In accordance with the present disclosure, information can be processed. In particular, it is possible to suppress non-uniformities of the imaging characteristic.

BRIEF DESCRIPTION OF THE DRAWINGS

FIG. 13 is a diagram showing typical light blocking layers and typical apertures;

FIG. 14 is a diagram showing other typical light blocking layers and other typical apertures;

DETAILED DESCRIPTION OF THE PREFERRED EMBODIMENTS

Embodiments of the present disclosure are explained as follows. It is to be noted that the explanation is divided into two topics arranged in the following order.
1. First Embodiment (Imaging Device)
2. Second Embodiment (Imaging Apparatus)<

1. First Embodiment

Imaging Device

[Non-Uniformities of Imaging Characteristics]

First of all, non-uniformities of imaging characteristics are explained.

Figure 1:
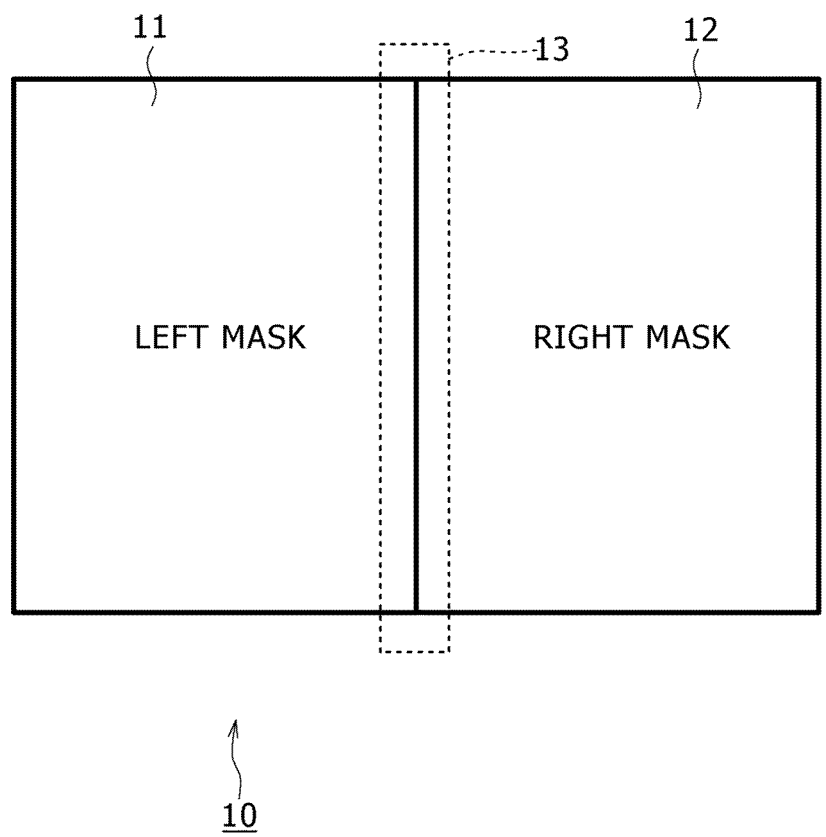
FIG. 1 is a block diagram showing a typical configuration of main components composing a CMOS (Complementary Metal Oxide Semiconductor) image sensor.

FIG. 1 is an explanatory diagram showing a typical CMOS (Complementary Metal Oxide Semiconductor) image sensor 10. The CMOS image sensor 10 shown in FIG. 1 is a solid-state imaging device made of a CMOS. The CMOS image sensor 10 includes a plurality of pixels each including a photodiode for converting light incident to the photodiode into signal electrical charge which is then amplified and propagated in the pixel.

The CMOS image sensor 10 shown in FIG. 1 is a sensor having a large chip size such as a 35 mm. In a process of making the CMOS image sensor 10, due to apparatus restrictions, the entire chip cannot be exposed at one time. Thus, the chip is exposed two times in a divided exposure process. For example, in a first process, the area on the left-hand side is exposed by making use of a left mask 11 whereas, in a second process, the area on the right-hand side is exposed by making use of a right mask 12.

Figure 2:
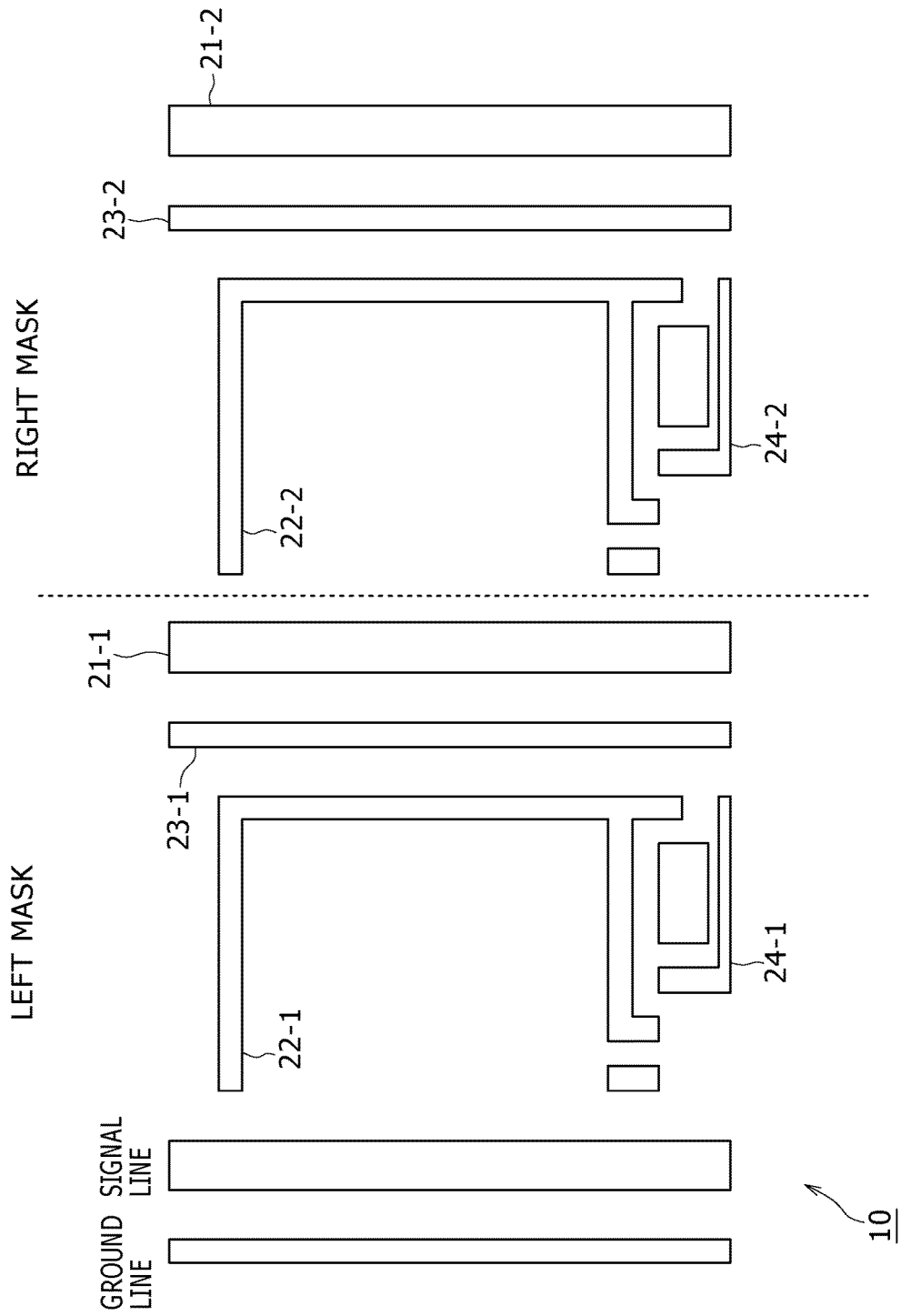
FIG. 2 is a diagram showing typical mask patterns of some pixels in the CMOS image sensor.

In the case of the technology in the past, the left mask 11 and the right mask 12 have the same mask pattern. That is to say, the pattern of transistors, wires and other components is uniform for all effective pixels employed in the CMOS image sensor 10. FIG. 2 is a diagram showing typical mask patterns of some wiring layers of some pixels in the vicinity of a joint between the left mask 11 and the right mask 12 which are provided for the CMOS image sensor 10. The vicinity of the joint between the left mask 11 and the right mask 12 is shown as an area 13 in FIG. 1. In FIG. 2, a vertical dashed line representing the joint between the left mask 11 and the right mask 12 is shown by being sandwiched between the mask pattern of the left mask 11 on the left-hand side and the mask pattern of the right mask 12 on the right-hand side. As shown in FIG. 2, pixels in the area 13 in the vicinity of the joint also are exposed by making use of the mask pattern common to the left mask 11 and the right mask 12.

In FIG. 2, a signal line 21-1, an FD (Floating Diffusion) line 22-1, a ground line 23-1 and a VDD 24-1 compose the wire mask pattern of the left mask 11 whereas a signal line 21-2, an FD line 22-2, a ground line 23-2 and a VDD 24-2 compose the wire mask pattern of the right mask 12. It is to be noted that, in the following description, each of the signal line 21-1 and the signal line 21-2 is also referred to simply as a signal line 21 in case there is no need for distinguishing the signal line 21-1 and the signal line 21-2 from each other. By the same token, each of the FD line 22-1 and the FD line 22-2 is also referred to simply as an FD line 22 in case there is no need for distinguishing the FD line 22-1 and the FD line 22-2 from each other. In the same way, each of the ground line 23-1 and the ground line 23-2 is also referred to simply as a ground line 23 in case there is no need for distinguishing the ground line 23-1 and the ground line 23-2 from each other. Likewise, each of the VDD 24-1 and the VDD 24-2 is also referred to simply as a VDD 24 in case there is no need for distinguishing the VDD 24-1 and the VDD 24-2 from each other.

As described above, in the case of the technology in the past, a mask pattern common to all pixels is generally applied to components of effective pixels employed in the imaging device such as the CMOS image sensor 10. However, it is difficult to make the imaging characteristics of all pixels completely uniform. That is to say, local and steady non-uniformities of the imaging characteristic may be generated in some cases. In the case of a configuration in which divided exposure processing is carried out as is the case with the CMOS image sensor 10 particularly, such non-uniformities are generated with ease in pixels in the area 13 in the vicinity of the joint between the left mask 11 and the right mask 12.

Figure 3:
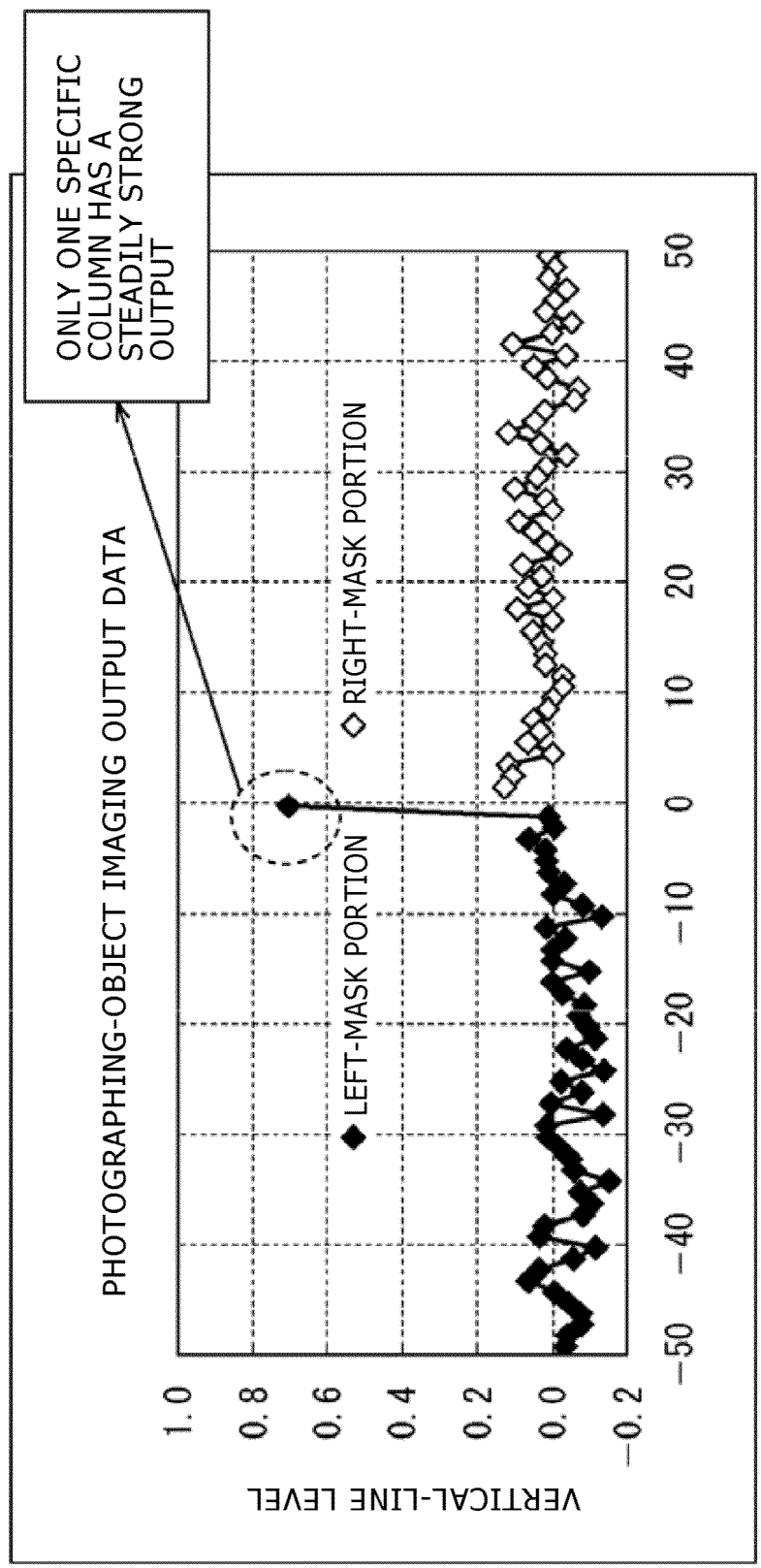
FIG. 3 is an explanatory diagram showing a local non-uniformity of an imaging characteristic.

A graph shown in FIG. 3 is comparison of imaging characteristics among pixel columns separated away from each other in the longitudinal direction. The graph shown in FIG. 3 compares the levels of signals each output by one of the pixel columns in the vicinity of the joint between the left and right masks. The signals are each output by one of the pixel columns typically in response to uniform incident light determined in advance or each output by one of the pixel columns in a state of no incident light. For example, the pixel columns are pixel columns in the area 13.

In the case of the graph shown in FIG. 3, the output of one particular pixel column on the side of the left mask 11 and in the joint between the left and right masks is steadily high in comparison with the outputs of other pixel columns. That is to say, a steady non-uniformity of the imaging characteristic is generated locally in this pixel column.

It is feared that the quality of an image output by the CMOS image sensor 10 deteriorates because a steady non-uniformity of the imaging characteristic is generated locally in such pixels of the CMOS image sensor 10.

[Luminance Line on the Output Image]

Figure 4:
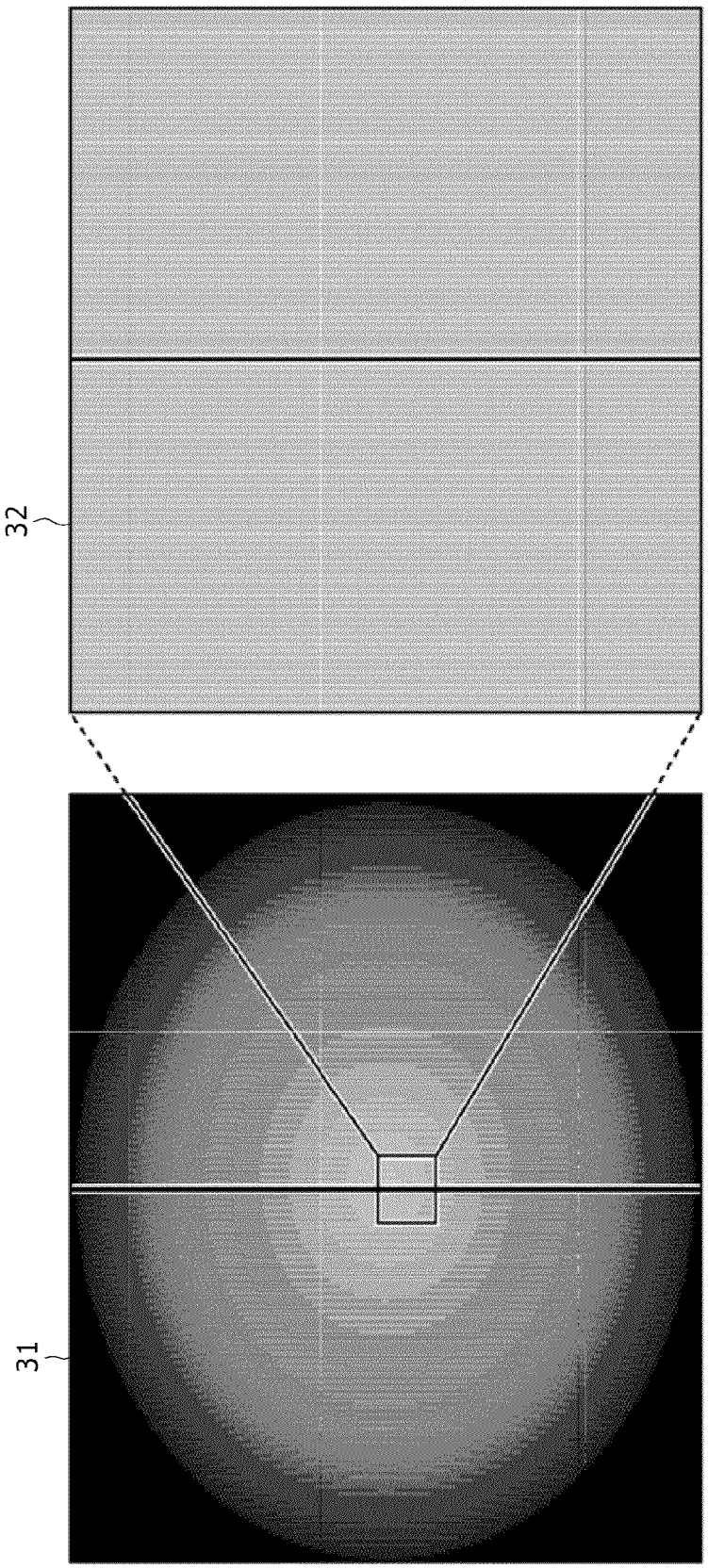
FIGS. 4A and 4B are explanatory diagrams each showing a local non-uniformity of an imaging characteristic.

FIGS. 4A and 4B are diagrams showing typical images generated by the CMOS image sensor 10. An image 31 shown in FIG. 4A is a black image obtained by the CMOS image sensor 10. The black image is typically an image output from pixels put in a state of no incident light. An image 32 shown in FIG. 4B is an enlarged image of an area on the image 31 shown in FIG. 4A. In FIG. 4A, the area is shown as a rectangular area.

As shown in FIGS. 4A and 4B, a line of a pixel column is generated on the images 31 and 32 at the position of a joint between an area exposed to light by the left mask 11 and an area exposed to light by the right mask 12. A line of such a pixel column is also referred to hereafter as a luminance line. That is to say, as described above by referring to the graph shown in FIG. 3, the output of one particular pixel column on the side of the left mask 11 and in the joint between the left and right masks is steadily high, and this steadily high output appears as the luminance line on the images 31 and 32 shown in FIGS. 4A and 4B. In other words, the quality of the output image deteriorates due to a local non-uniformity of the imaging characteristics of some pixels.

Thus, the camera set employing the CMOS image sensor is required to make corrections in order to suppress such deteriorations of the quality of the output image. As a result, it is feared that the manufacturing cost of the camera set increases.

[Local Change of the Mask Pattern]

In order to suppress such local and steady non-uniformities among the imaging characteristics of pixels and, thus, in order to suppress image-quality deteriorations caused by the non-uniformities, the mask pattern which should be naturally uniform for all pixels is locally changed. That is to say, in the process of manufacturing the CMOS image sensor, the exposure processing is carried out by making use of a mask having a mask pattern provided for some pixels as a mask pattern different from a mask pattern provided for other pixels. In other words, in order to suppress such local and steady non-uniformities among the imaging characteristics of pixels, that is, in order to suppress image-quality deteriorations caused by the non-uniformities, the layout of the structure of each of some pixels in the CMOS image sensor is made different from the layout of the structure of each of other pixels. It is to be noted that the structure of a pixel is the structure of all layers forming the pixel. The structure of a pixel typically includes each wire and each transistor which form the pixel.

The following description explains a case in which the area of effective pixels is divided into two areas on the left-hand side and the right-hand side and the exposure process is carried out by making use of the left mask 11 and the right mask 12 respectively as is the case with the CMOS image sensor 10 shown in FIG. 1. In addition, it is assumed that, at that time, as described above, if a common mask pattern is used, the output of one pixel column on the side of the left mask 11 and in the joint between the left and right masks is steadily high in comparison with the outputs of other pixel columns as is the case with the typical example shown in FIG. 3.

Figure 5:
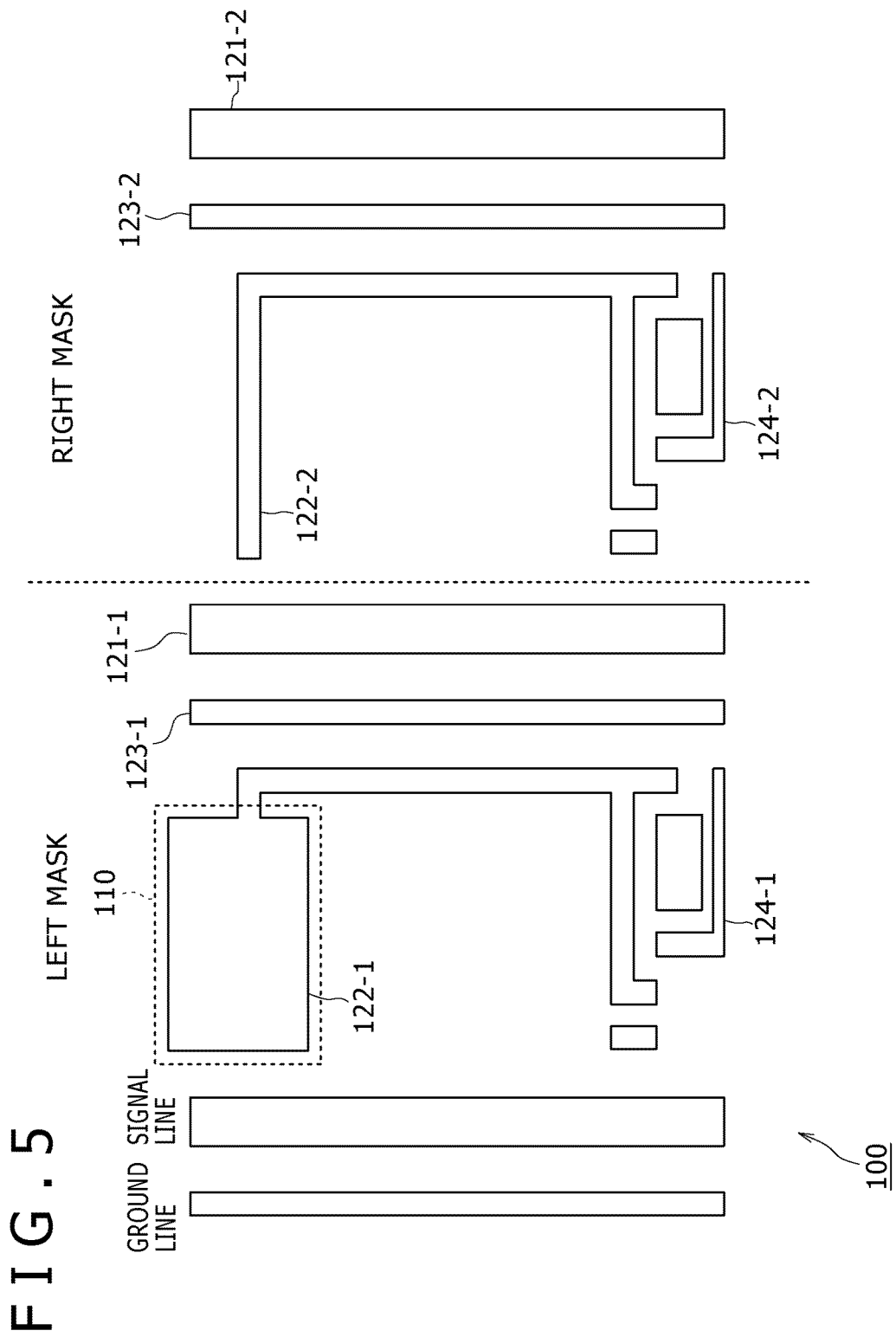
FIG. 5 is a diagram showing other typical mask patterns of some pixels in the CMOS image sensor.

In the exposure process of some wiring layers of such a CMOS image sensor, masks having mask patterns like ones shown in FIG. 5 are typically used. FIG. 5 is a diagram showing typical mask patterns of the left mask 11 and the right mask 12. In addition, FIG. 5 also shows a wiring layout of a CMOS image sensor obtained as a result of an exposure process carried out by making use of the left mask 11 and the right mask 12 in order to create the sensor. In FIG. 5, a signal line 121-1, an FD line 122-1, a ground line 123-1 and a VDD 124-1 form the mask pattern of the left mask 11 whereas a signal line 121-2, an FD line 122-2, a ground line 123-2 and a VDD line 124-2 form the mask pattern of the right mask 12. It is to be noted that, in the following description, each of the signal line 121-1 and the signal line 121-2 is also referred to simply as a signal line 121 in case there is no need for distinguishing the signal line 121-1 and the signal line 121-2 from each other. By the same token, each of the FD line 122-1 and the FD line 122-2 is also referred to simply as an FD line 122 in case there is no need for distinguishing the FD line 122-1 and the FD line 122-2 from each other. In the same way, each of the ground line 123-1 and the ground line 123-2 is also referred to simply as a ground line 123 in case there is no need for distinguishing the ground line 123-1 and the ground line 123-2 from each other. Likewise, each of the VDD 124-1 and the VDD 124-2 is also referred to simply as a VDD 124 in case there is no need for distinguishing the VDD 124-1 and the VDD 124-2 from each other.

In the case of this typical example, only in one pixel column placed on the side of the left mask 11 and in the joint between the left mask 11 and the right mask 12, as shown in FIG. 5, the width of a portion of an AL (aluminum) line serving as the FD line 122-1 is greater than the widths of lines in other pixels. In the process of manufacturing a CMOS image sensor 100 shown in the figure, an exposure process is carried out by making use of the left mask 11 and the right mask 12 which have such mask patterns. That is to say, the CMOS image sensor 100 has wiring layouts like the ones shown in FIG. 5. To put it more concretely, the CMOS image sensor 100 has the same circuit configuration as the CMOS image sensor 10 described earlier except that, only in some pixels in one pixel column placed on the side of the left mask 11 and in the joint between the left mask 11 and the right mask 12, the width of a portion of the FD line 122-1 is greater than those of other pixels. That is to say, the portion is wider than those of other pixels. The portion of the FD line 122-1 is shown in FIG. 5 as a dashed-line block 110.

By increasing the width of a line, the wiring capacitance C of the line can be raised. In general, the smaller the capacitance C, the larger the conversion efficiency. Thus, if the capacitance C is small, for the same amount of signal electric charge, a higher signal voltage can be obtained as a result of conversion of the signal electric charge into the voltage. That is to say, in the case of the typical example shown in FIG. 5, by increasing the width of a portion of an AL line serving as the FD line 122-1 in a pixel, the wiring capacitance C of the FD line 122-1 can be raised so that the conversion efficiency of an FD (Floating Diffusion) in the pixel can be reduced.

Figure 6:
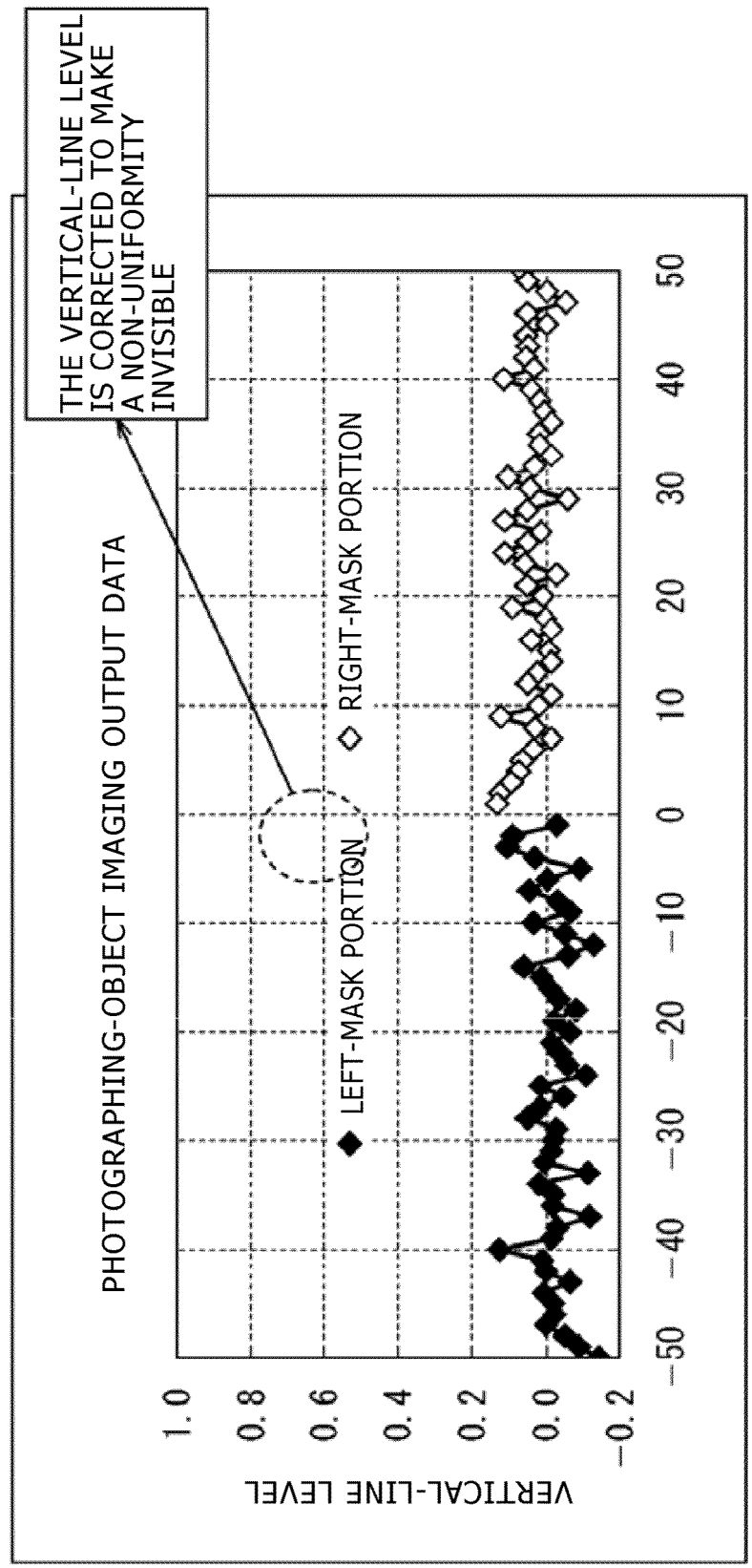
FIG. 6 is an explanatory diagram showing an imaging characteristic.

Such a mask-pattern change is made only to one pixel column on the side of the left mask 11 and in the joint between the left mask 11 and the right mask 12. One pixel column is a portion having a high conversion efficiency from the very start. That is to say, such a mask-pattern change is made locally. Thus, only the conversion efficiency of one pixel column on the side of the left mask 11 and in the joint between the left mask 11 and the right mask 12 is reduced. As indicated by a graph shown in FIG. 6, only the output of this pixel column is reduced. In other words, a local and steady non-uniformity of the imaging characteristic is suppressed.

By providing the CMOS image sensor 100 with a pixel configuration created by making use of such a mask pattern, it is possible to prevent a luminance line from being generated on the output image as shown in FIGS. 4A and 4B and, thus, improve the quality of the image. In the case of this example, the pixel configuration is a wiring layer. In addition, the CMOS image sensor 100 is capable of avoiding the generation of the luminance line by making a local change of a mask pattern as described above. Thus, the cost increase can be suppressed in comparison with a case in which the output image is corrected by carrying out image processing. In the case of this example, the mask pattern is a wiring layout.

It is to be noted that methods for changing a local wiring layout are not limited to the typical method explained above by referring to FIG. 5. That is to say, it is possible to adopt any other method as long as the other method can be used for changing a wiring capacitance as described above.

[Other Typical Wiring Layouts]

Figure 7:
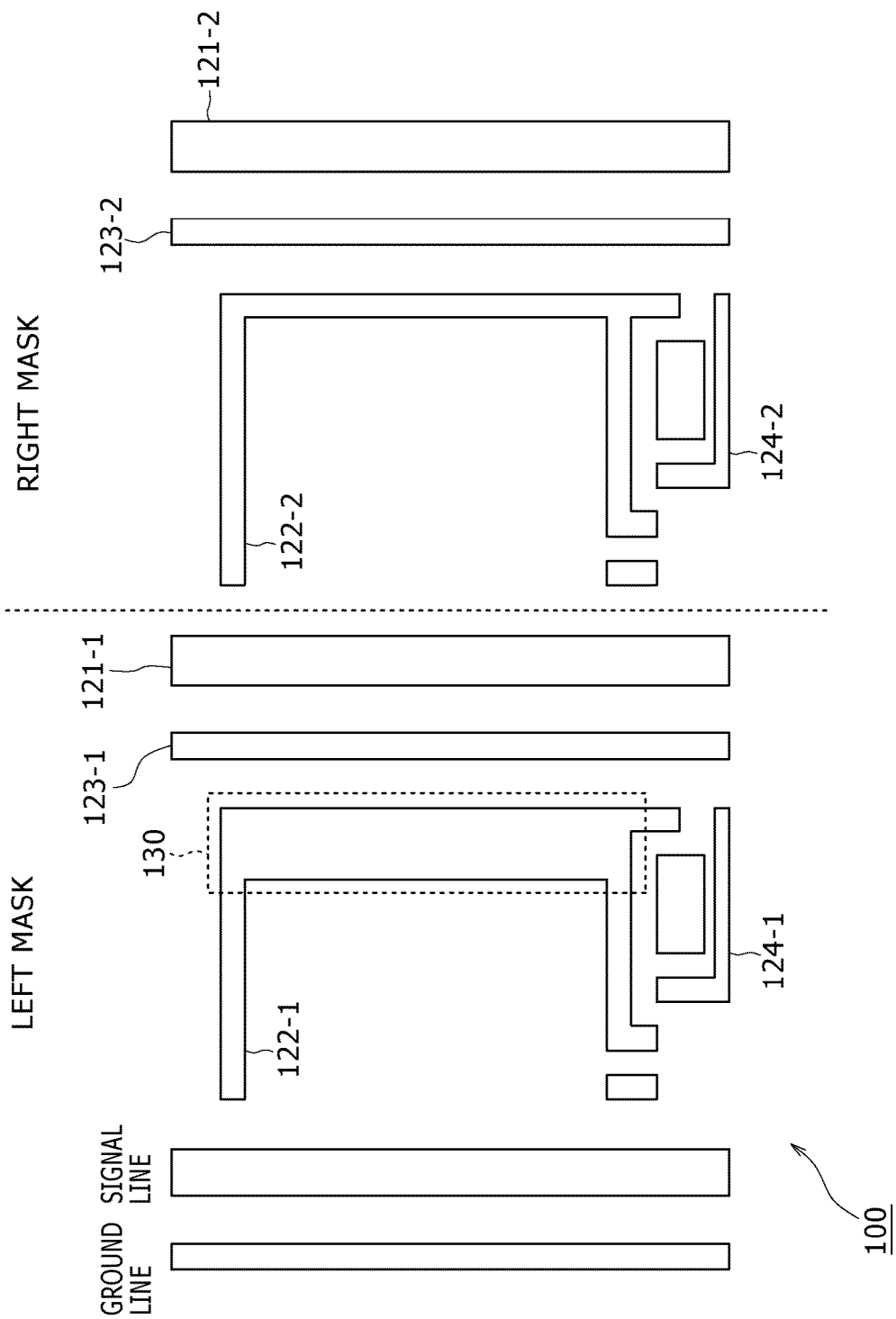
FIG. 7 is a diagram showing further typical mask patterns of some pixels in the CMOS image sensor.
Figure 8:
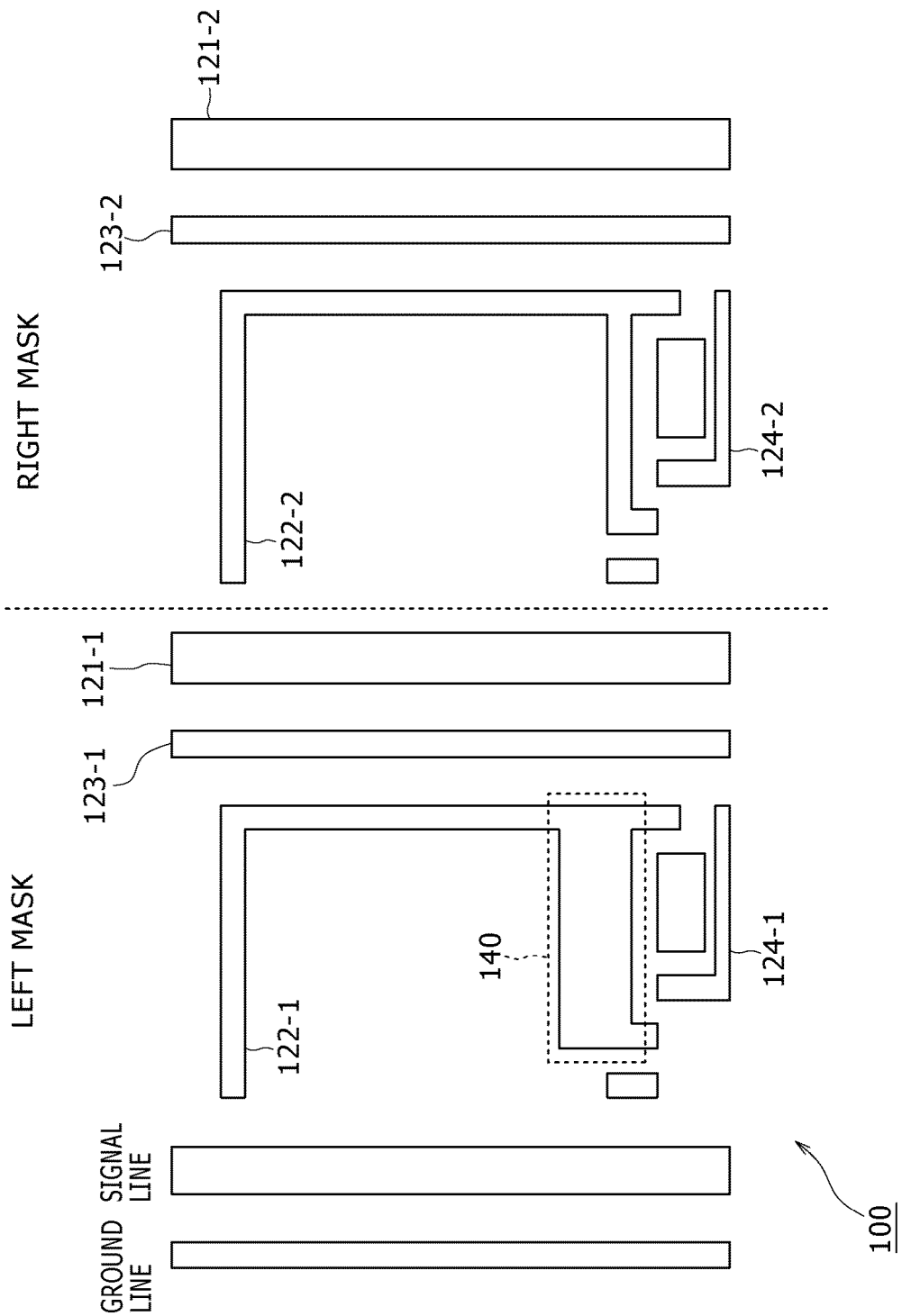
FIG. 8 is a diagram showing still further typical mask patterns of some pixels in the CMOS image sensor.
Figure 9:
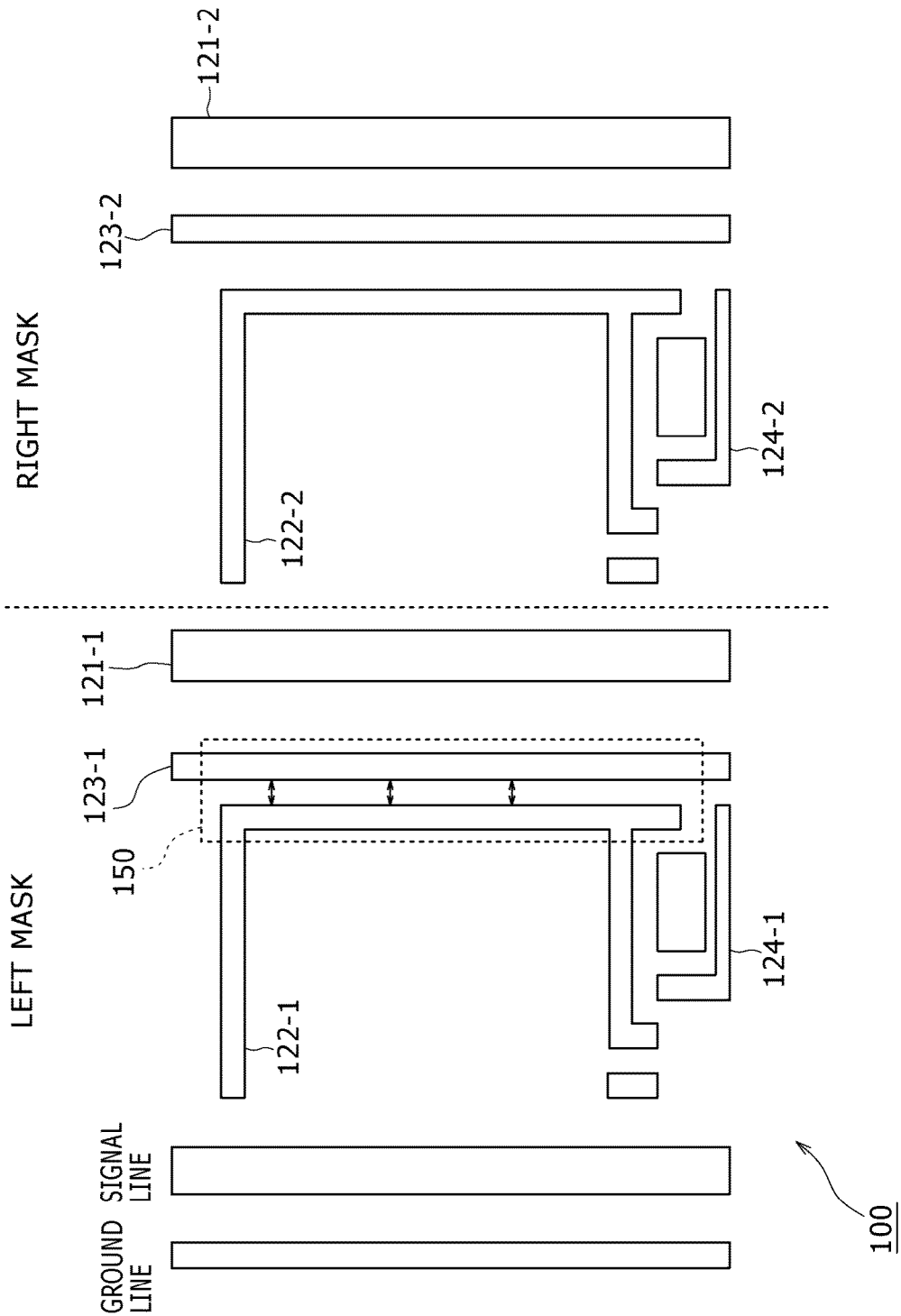
FIG. 9 is a diagram showing still further typical mask patterns of some pixels in the CMOS image sensor.

As shown in FIG. 7 for example, it is also possible to increase the wiring width of a portion enclosed by a dashed line 130 to serve as a portion of the FD line 122-1. As another example, it is also possible to increase the wiring width of a portion enclosed by a dashed line 140 to serve as a portion of the FD line 122-1 as shown in FIG. 8. As a further example, instead of increasing a wiring width of the FD line 122-1, it is also possible to decrease the gap between the FD line 122-1 and the ground line 123-1 as shown in FIG. 9. In FIG. 9, the gap is enclosed by a dashed line 150. In all the cases, the wiring capacitance of the FD line is increased so that the conversion efficiency of the FD can be decreased.

[Modified Versions]

The above description explains methods for changing a mask pattern (and, hence, the layout of the configuration of a pixel created by making use of a mask having the changed mask pattern) in order to reduce an excessively high conversion efficiency. However, the methods for changing a mask pattern are not limited to the methods for reducing an excessively high conversion efficiency. That is to say, it is also possible to increase an excessively low conversion efficiency. A typical method in this case is obtained by reversing any one of the methods described so far. For example, the wiring capacitance of an FD line is decreased typically by making the FD line thinner or increasing the gap between the specific FD line and a ground line adjacent to the FD line. By decreasing the wiring capacitance of the FD line, the conversion efficiency of the FD can be increased.

Figure 10:
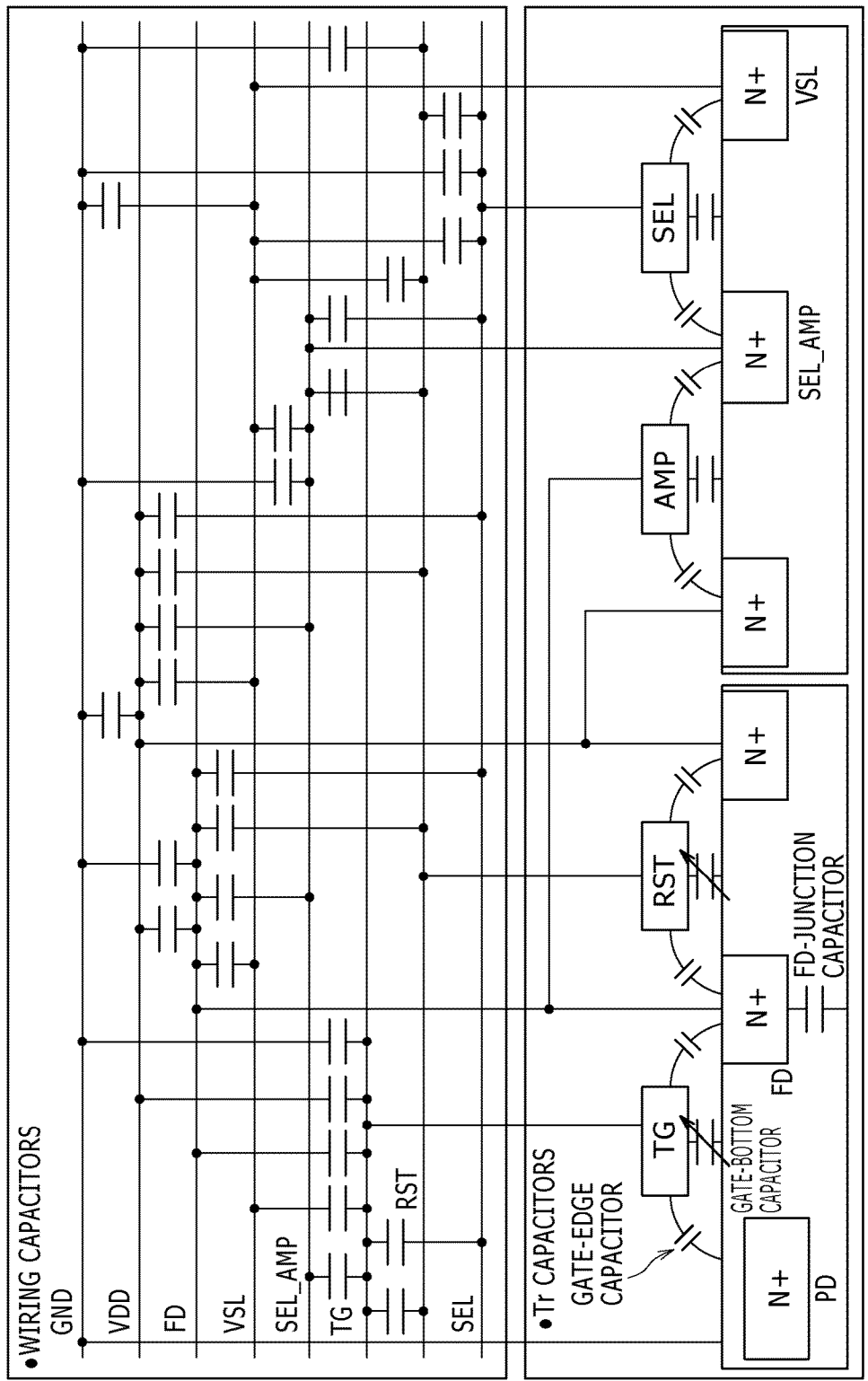
FIG. 10 is a diagram showing a typical model of capacitors existing between lines and transistors in the CMOS image sensor.

It is to be noted that the capacitance of the FD is dependent on not only the wiring capacitance of the FD line, but also typically a diffusion capacitance and the capacitance of a portion overlapping a gate electrode. FIG. 10 is a diagram showing a typical model of capacitors existing between lines and transistors in a CMOS image sensor like the one described above. As shown in FIG. 10, capacitors exist between lines and transistors. The CMOS image sensor can also be designed to control capacitances existing at any arbitrary locations in the sensor.

Figure 11:
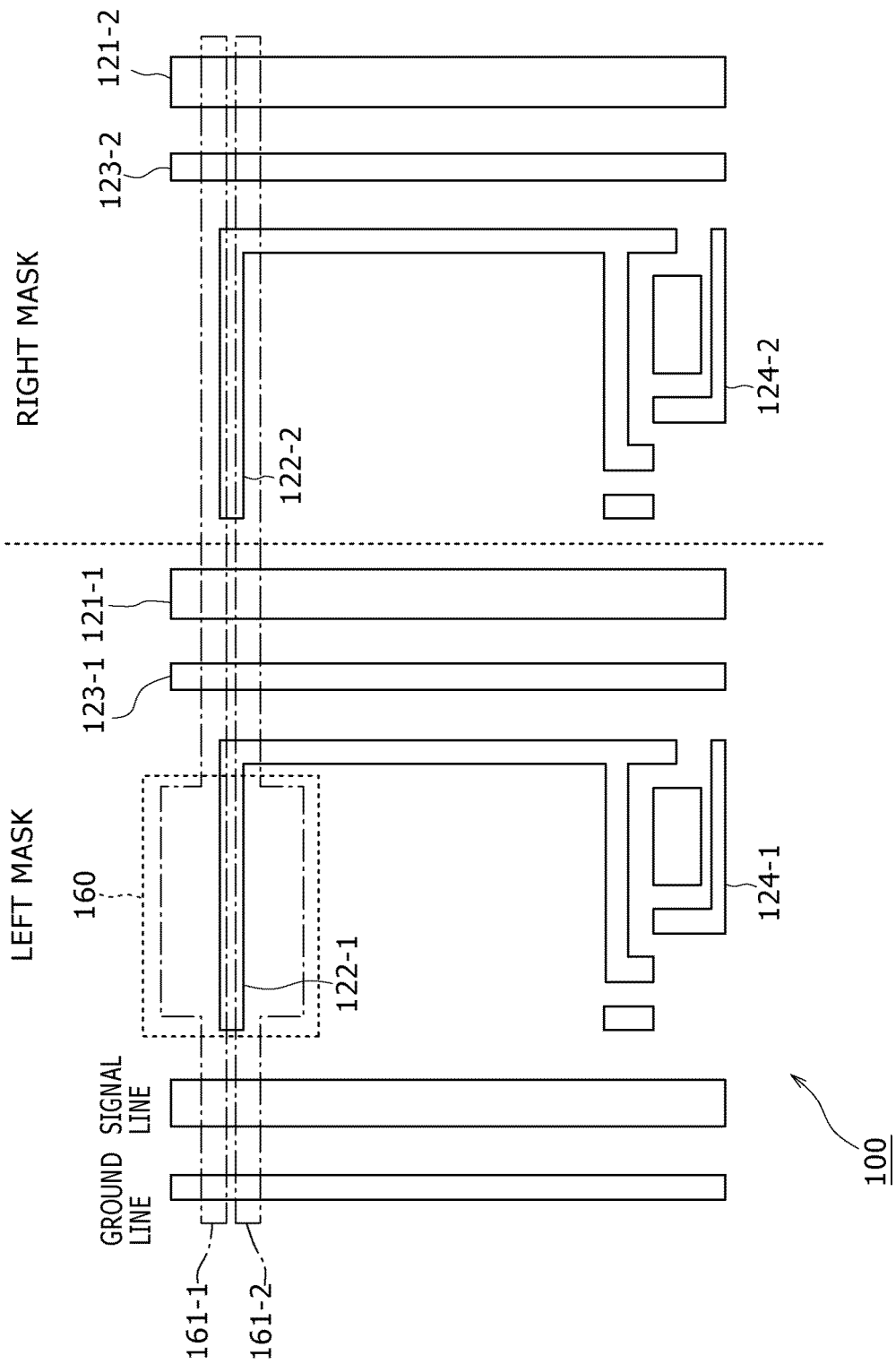
FIG. 11 is a diagram showing still further typical mask patterns of some pixels in the CMOS image sensor.

As shown in FIG. 11 for example, it is also possible to change the wiring capacitance of a line in a layer other than the wiring layer in each of the pixels described above. In the case of a typical example shown in FIG. 11, on another wiring layer of the CMOS image sensor 100, lines 161-1 and 161-2 are provided to overlap the FD lines 122-1 and 122-2. To put it in detail, a specific portion of the line 161-1 has a wiring width greater than that of other portions of the line 161-1 and overlaps a portion of the FD line 122-1 whereas a specific portion of the line 161-2 has a wiring width greater than that of other portions of the line 161-2 and overlaps the portion of the FD line 122-1. In FIG. 11, the specific portion of the line 161-1 and the specific portion of the line 161-2 are enclosed by a dashed-line block 160. Thus, in the CMOS image sensor 100, it is possible to increase the capacitance of a capacitor existing between the line 161-1 and the FD line 122-1 as well as the capacitance of a capacitor existing between the line 161-2 and the FD line 122-1. As a result, it is possible to decrease the conversion efficiency of the pixel existing on the left mask shown in FIG. 11 to serve as a pixel having a high conversion efficiency from the very start.

Figure 12:
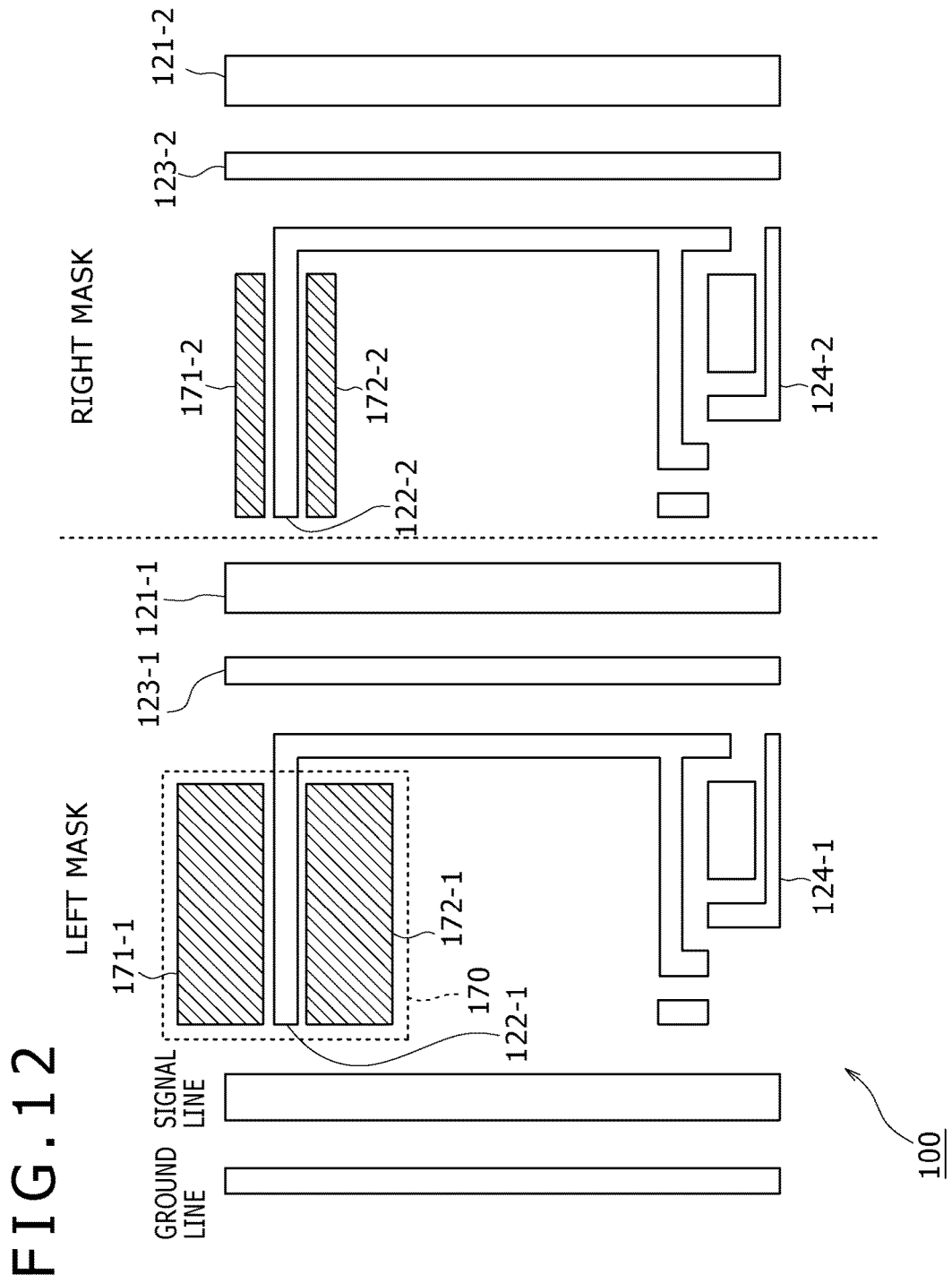
FIG. 12 is a diagram showing still further typical mask patterns of some pixels in the CMOS image sensor.

In addition, it is also possible to change a conversion efficiency in typically the layout of a pixel section. As shown in a typical configuration illustrated in FIG. 12 for example, it is also possible to change the size of a read gate and an FD-section creation implant pattern. In the case of the typical configuration shown in FIG. 12, the CMOS image sensor 100 includes a dashed-line block 170 enclosing read gates 171-1 and 172-1 associated with the FD line 122-1 of the left mask. The sizes of the read gates 171-1 and 172-1 are made large in comparison with those of other read gates in the other pixel, such as 171-2 and 172-2. That is to say, the read gates 171-1 and 172-1 are made thicker than those of other read gates in the same pixel. Thus, in the CMOS image sensor 100, it is possible to increase the capacitance of a capacitor existing between the read gate 171-1 and the FD line 122-1 as well as the capacitance of a capacitor existing between the read gate 172-1 and the FD line 122-1. As a result, it is possible to decrease the conversion efficiency of the pixel existing on the left mask shown in FIG. 12 to serve as a pixel having an excessively high conversion efficiency from the very start.

It is to be noted that the method described above can also be reversed in the same way as the wiring layer explained before. To be more specific, the sizes of the read gates 171-1 and 172-1 enclosed in the dashed-line block 170 to serve as read gates associated with the FD line 122-1 of the left mask are made small in comparison with those of other read gates in the other pixel, such as 171-2 and 172-2. Thus, in the CMOS image sensor 100, it is possible to decrease the capacitance of a capacitor existing between the read gate 171-1 and the FD line 122-1 as well as the capacitance of a capacitor existing between the read gate 172-1 and the FD line 122-1. As a result, it is possible to increase the conversion efficiency of the pixel created by making use of the left mask to serve as a pixel having an excessively low conversion efficiency from the very start.

That is to say, a mask is used for generating all layers not limited to the wiring layer. Thus, in order to change a capacitance, it is possible to change the mask pattern of a mask for not only the AL-wiring layer, but also any arbitrary portion of any arbitrary layer. In other words, in the CMOS image sensor, the mask pattern of a mask for any arbitrary portion of any arbitrary layer in any arbitrary pixel can be made different from that of other pixels. It is desirable, however, to change the configuration of a mask pattern in such a way that there is no effect on capacitances other than the capacitance to be changed. For example, it is desirable to change the layout of lines or transistors in such a way that there is no effect on capacitances other than capacitances of interest.

If an AL wiring pattern is changed in order to reduce the gap between AL lines adjacent to each other in the pattern for example, the wiring capacitance between the lines is increased. In this case, however, it is quite within the bounds of possibility that the capacitive coupling between the AL lines is also increased as well. The increased capacitive coupling is not limited to the capacitive coupling between lines.

If the distance between an FD line and a gate electrode is shortened excessively in a careless manner for example, it is quite within the bounds of possibility that the capacitive coupling between the FD line and the gate electrode is also increased to a level that can no longer be ignored. In addition, for example, it is also quite within the bounds of possibility that the aperture ratio of the photodiode is undesirably reduced if an AL wiring pattern is changed. It is thus desirable to change a mask pattern or the layout of the structure of a pixel in such a way that there are not a variety of such side effects including an inadvertent adverse effect on an unintended object other than an element to be changed from the very start. For this reason, a change of an AL wiring pattern can be made most easily. In the case of the typical examples described above, it is possible to easily make a layout change which does not have an effect on the aperture ratio of the pixel.

It is to be noted that the imaging characteristic of a pixel can also be controlled by intentionally change the aperture ratio of the pixel. In the case of a typical example shown in FIG. 13 for example, in every pixel, there are created a light blocking layer 181-1 or 181-2 for restricting light incident to the photodiode of the pixel by making use of typically a light blocking film, an AL line or the like. The light blocking layer 181-1 has a portion superposed on the photodiode, and an aperture 182-1 is provided on this portion. By the same token, the light blocking layer 181-2 has a portion superposed on the photodiode, and an aperture 182-2 is provided on this portion. In the case of an ordinary light blocking layer, the size of the aperture is uniform for all pixels.

As is obvious from a typical example shown in FIG. 14, the size of the aperture 182-1 provided on the portion of the light blocking layer 181-1 is intentionally made smaller than the aperture of the other pixel. For example, the size of the aperture 182-1 provided on the portion of the light blocking layer 181-1 is intentionally made smaller than the size of the aperture 182-2 provided on the portion of the light blocking layer 181-2. The aperture 182-1 of the pixel created by making use of the left mask shown in FIG. 14 has an excessively high conversion efficiency from the very start. By reducing the size of the aperture 182-1 in this way, the conversion efficiency of the pixel can be decreased. That is to say, by reducing the size of the aperture 182-1, it is possible to suppress the local and steady non-uniformity of the imaging characteristic.

It is needless to say that the method described above can also be reversed in the same way as the wiring layer explained before. To be more specific, the size of the aperture 182-1 provided on the portion of the light blocking layer 181-1 is intentionally made larger than the aperture of the other pixel. For example, the size of the aperture 182-1 provided on the portion of the light blocking layer 181-1 is intentionally made larger than the size of the aperture 182-2 provided on the portion of the light blocking layer 181-2. This is because the aperture 182-1 of the pixel created by making use of the left mask shown in FIG. 14 has an excessively low conversion efficiency from the very start. By increasing the size of the aperture 182-1 in this way, the conversion efficiency of the pixel can be increased.

The above description has explained a local and steady non-uniformity of the imaging characteristic in the vicinity of a joint between the masks on the left-hand and right-hand sides. However, the cause of the non-uniformity of the imaging characteristic is not limited to what has been described above. It is thus quite within the bounds of possibility that a local and steady non-uniformity of the imaging characteristic is generated at any arbitrary position of a pixel group in the CMOS image sensor. That is to say, the CMOS image sensor provided by the present disclosure does not have to be a sensor having a joint exposure type like the one described above.

Figure 15A:
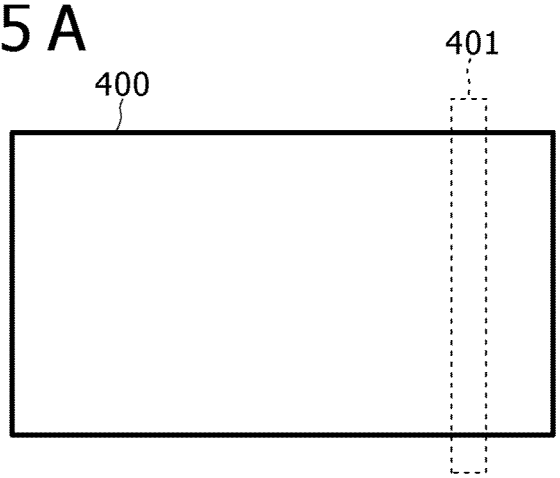
FIGS. 15A to 15C are explanatory diagrams each showing the location of a non-uniformity of the imaging characteristic.

As an example, a CMOS image sensor 400 shown in FIG. 15A does not have a joint between masks. However, a vertical line is generated on a pixel column in a vertical direction determined in advance. In the case of the typical example shown in this figure, the pixel column is shown as a vertical-line generation pixel column 401. In the CMOS image sensor 400, only the layout of the configuration of each pixel on the vertical-line generation pixel column 401 is changed in order to suppress a local and steady non-uniformity of the imaging characteristic. In this way, the present disclosure can also be applied to a pixel column existing in the vertical direction at a location other than a location which would otherwise be allocated to the joint between masks.

Figure 15B:
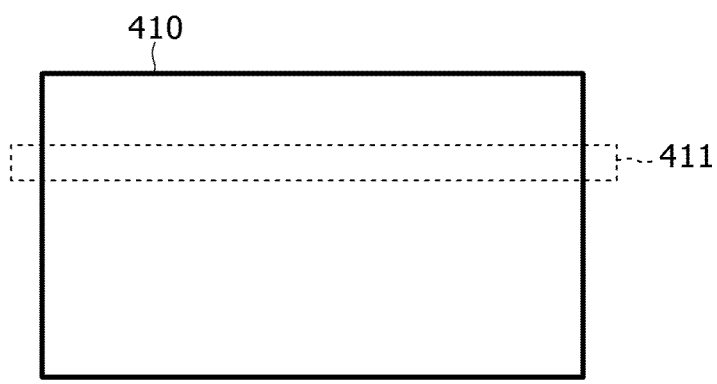

As another example, a CMOS image sensor 410 shown in FIG. 15B also does not have a joint between masks. However, a horizontal line is generated on a pixel row in a horizontal direction determined in advance. In the case of the typical example shown in this figure, the pixel row is shown as a horizontal-line generation pixel row 411. In the CMOS image sensor 410, only the layout of the configuration of each pixel on the horizontal-line generation pixel row 411 is changed in order to suppress a local and steady non-uniformity of the imaging characteristic. In this way, the present disclosure can also be applied to a pixel row oriented in the horizontal direction at a location other than a location which would otherwise be allocated to the joint between masks.

Figure 15C:
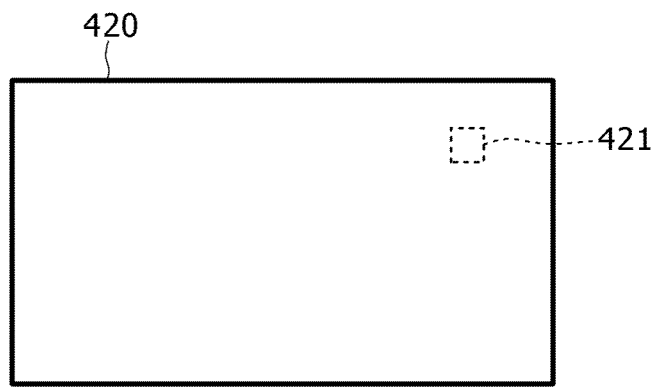

As a further example, a CMOS image sensor 420 shown in FIG. 15C also does not have a joint between masks. However, an abnormality is generated in a group of some pixels determined in advance. In the case of the typical example shown in this figure, the group of pixels is shown as a point-defect/lump-defect generation location 421. In the CMOS image sensor 420, only the layout of the configuration of each pixel at the point-defect/lump-defect generation location 421 is changed in order to suppress the abnormality serving as a local and steady non-uniformity of the imaging characteristic. In this way, the present disclosure can also be applied to a pixel group which can be a point-defect or lump-defect pixel group generated at a location other than a location which would otherwise be allocated to the joint between masks.

It is needless to say that there may be more than one location or one area at or in which the layout of the configuration of every pixel is to be changed. That is to say, it is possible to change the layout of the configuration of every pixel at a plurality of locations or a plurality of areas.

2. Second Embodiment

Imaging Apparatus

The CMOS image sensor described so far can be employed in an apparatus to serve as a section of the apparatus. For example, the CMOS image sensor can be embedded in an imaging apparatus.

Figure 16:
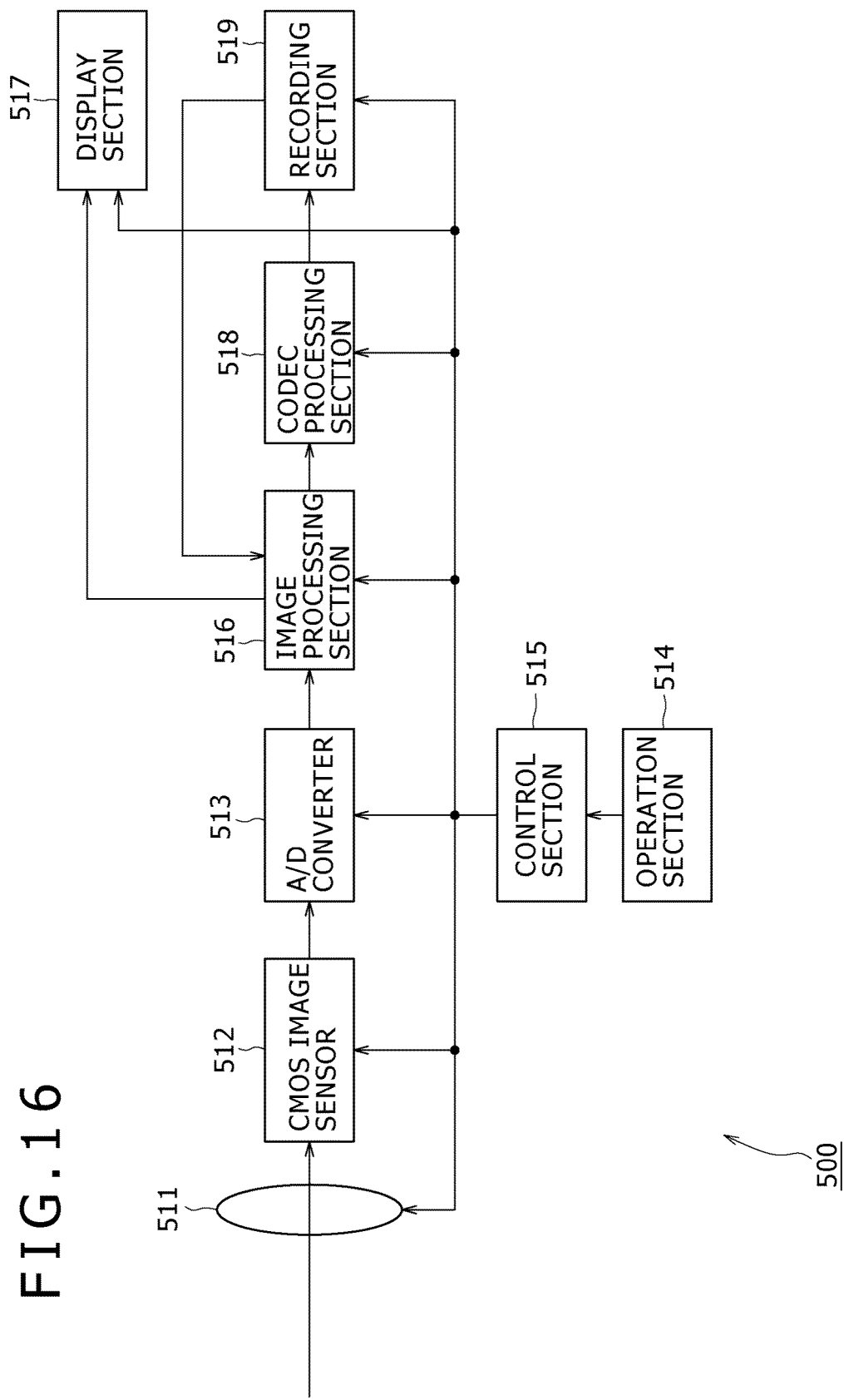
FIG. 16 is a block diagram showing a typical configuration of main components composing an image apparatus.

FIG. 16 is a block diagram showing a typical configuration of main elements composing an image apparatus 500 provided by the present disclosure.

As shown in FIG. 16, the imaging apparatus 500 includes a lens section 511, a CMOS image sensor 512, an A/D (Analog to Digital) converter 513, an operation section 514, a control section 515, an image processing section 516, a display section 517, a codec processing section 518 and a recording section 519.

The lens section 511 adjusts the focal point to the photographing object and converges light coming from an in-focus position to which the focal point has been adjusted. Then, the lens section 511 supplies the converged light to the CMOS image sensor 512.

The CMOS image sensor 512 is a solid-state imaging device having a structure described earlier. The CMOS image sensor 512 receives light incident thereto and carries out a photoelectric conversion process of converting the incident light into an analog voltage signal according to the intensity of the light. Then, the CMOS image sensor 512 supplies the analog voltage signal to the A/D converter 513. The CMOS image sensor 512 can be any one of the CMOS image sensors 100, 400, 410 and 420 which have been described before. That is to say, the technology according to the present disclosure can be applied to the CMOS image sensor 512.

The A/D converter 513 receives the analog voltage signal supplied thereto by the CMOS image sensor 512 with a timing determined in advance for every pixel. The A/D converter 513 converts the analog voltage signal into a digital image signal also properly referred to hereafter as a pixel signal and sequentially supplies the image signals to the image processing section 516 with timings determined in advance.

The operation section 514 is configured to typically include a jog dial (a trademark), keys, buttons and a touch panel, to mention a few. The user enters an operation input by operating the operation section 514 whereas the operation section 514 supplies a signal representing the operation input to the control section 515.

On the basis of the signal received from the operation section 514 to serve as a signal representing the operation input entered by the user, the control section 515 controls the lens section 511, the CMOS image sensor 512, the A/D converter 513, the image processing section 516, the display section 517, the codec processing section 518 and the recording section 519.

The image processing section 516 carries out various kinds of image processing on the image signal received from the A/D converter 513 and supplies an image signal obtained as a result of the image processing to the display section 517 and the codec processing section 518. The image processing includes a variety of processes such as a white balance process, a demosaic process, a matrix process, a gamma correction process and a YC conversion process, to mention a few.

The display section 517 is configured to include a liquid-crystal display unit or the like. The display section 517 displays an image of the photographing object on the basis of an image signal received from the image processing section 516.

The codec processing section 518 carries out an encoding process according to a method determined in advance on the basis of an image signal received from the image processing section 516 and supplies image data obtained as a result of the encoding process to the recording section 519.

The recording section 519 records the image data received from the codec processing section 518 into a memory employed in the recording section 519. If necessary, the image data recorded in the recording section 519 is read out by the image processing section 516 which then supplies the image data to the display section 517 for displaying an image based on the data.

It is to be noted that the configuration of the imaging apparatus employing a solid-state imaging device based on the technology according to the present disclosure is not limited to the configuration described above. In other words, the imaging apparatus employing a solid-state imaging device based on the technology according to the present disclosure can also have another configuration.

In addition, as described above, the implementation of the present disclosure is one imaging apparatus or one imaging device. However, the implementation of the present disclosure can also be a plurality of imaging apparatus or a plurality of imaging devices. Conversely, configurations explained in the above descriptions as configurations including a plurality of imaging apparatus or a plurality of imaging devices can be integrated into a configuration of one imaging apparatus or one imaging device respectively. On top of that, it is needless to say that a configuration other than what is described above can also be added to the configuration of every imaging apparatus or every imaging device. Furthermore, if a configuration or an operation are practically uniform throughout the entire system, a portion of the configuration of a certain imaging apparatus or a certain imaging device can also be included in another imaging apparatus or another imaging device. That is to say, implementations of the present disclosure are not limited to the embodiments described earlier. In other words, a variety of changes can be made to the embodiments as long as the changes fall within a range not deviating from the scope of the present disclosure.

It is to be noted that the technology provided by the present disclosure can also be applied to the following implementations.

(1) An imaging device including
   at least one special pixel with a configuration having a layout made different from the layout of the configuration of each pixel other than the special pixel.

(2) The imaging device according to implementation (1), wherein the special pixel is a pixel having an imaging characteristic steadily different from that of the other pixels and a difference in layout between the configuration of the special pixel; and
   the configuration of the other pixels is used to suppress a non-uniformity of the imaging characteristic exhibited by the special pixel.

(3) The imaging device according to implementation (1) or (2), wherein the special pixel is a pixel in the vicinity of a joint between masks.

(4) The imaging device according to any one of implementations (1) to (3), wherein the special pixel includes an aluminum line having a shape made different from that of the other pixels.

(5) The imaging device according to implementation (4), wherein the special pixel includes the aluminum line made thicker than that for each of the other pixels.

(6) The imaging device according to implementation (4), wherein the special pixel includes the aluminum line made thinner than that for each of the other pixels.

(7) The imaging device according to any one of implementations (4) to (6), wherein the aluminum line is a line of a floating diffusion section.

(8) The imaging device according to any one of implementations (1) to (7), wherein the special pixel includes an aluminum line provided at a location different from that for each of the other pixels.

(9) The imaging device according to implementation (8), wherein the special pixel includes mutually adjacent aluminum lines separated from each other by a gap made narrower than that for each of the other pixels.

(10) The imaging device according to implementation (8), wherein the special pixel includes mutually adjacent aluminum lines separated from each other by a gap made wider than that for each of the other pixels.

(11) The imaging device according to any one of implementations (8) to (10), wherein the aluminum lines are a line of a floating diffusion section and a ground line.

(12) The imaging device according to any one of implementations (1) to (11), wherein the special pixel includes a read gate with a size made different from that for each of the other pixels.

(13) The imaging device according to implementation (12), wherein the special pixel includes the read gate with a size made larger than that for each of the other pixels.

(14) The imaging device according to implementation (12), wherein the special pixel includes the read gate with a size made smaller than that for each of the other pixels.

(15) The imaging device according to any one of implementations (1) to (14), wherein the special pixel has a floating-diffusion-section creation implant pattern made different from that for each of the other pixels.

(16) The imaging device according to any one of implementations (1) to (15), wherein the special pixel has an aperture with a size made different from that for each of the other pixels.

(17) The imaging device according to implementation (16), wherein the special pixel has the aperture with a size made smaller than that for each of the other pixels.

(18) The imaging device according to implementation (16), wherein the special pixel has the aperture with a size made larger than that for each of the other pixels.

(19) An imaging apparatus including an imaging device including one special pixel with a configuration having a layout made different from the layout of the configuration of each pixel other than the special pixel.

The present disclosure contains subject matter related to that disclosed in Japanese Priority Patent Application JP 2011-147932 filed in the Japan Patent Office on Jul. 4, 2011, the entire content of which is hereby incorporated by reference.

What is claimed is:

1. An imaging device comprising:
at least one special pixel with a configuration having a layout made different from the layout of the configuration of each pixel other than said special pixel,
wherein said special pixel comprises a metallic line provided at a location different from that for each of pixels other than said special pixel, and wherein said special pixel comprises mutually adjacent metallic lines separated from each other by a gap made narrower than that for each of said other pixels.

2. The imaging device according to claim 1, wherein said special pixel is a pixel having an imaging characteristic steadily different from that of pixels other than said special pixel, and a difference in layout between the configuration of said special pixel and the configuration of said other pixels is used to suppress a non-uniformity of said imaging characteristic exhibited by said special pixel.

3. The imaging device according to claim 1, wherein said special pixel includes an aluminum line having a shape made different from that of pixels other than said special pixel.

4. The imaging device according to claim 3, wherein said special pixel includes said aluminum line made thicker than that for each of said other pixels.

5. The imaging device according to claim 3, wherein said special pixel includes said aluminum line made thinner than that for each of said other pixels.

6. The imaging device according to claim 3, wherein said aluminum line is a line of a floating diffusion section.

7. The imaging device according to claim 1, wherein said special pixel includes an aluminum line provided at a location different from that for each of pixels other than said special pixel.

8. The imaging device according to claim 7, wherein said special pixel includes mutually adjacent aluminum lines separated from each other by a gap made narrower than that for each of said other pixels.

9. The imaging device according to claim 7, wherein said special pixel includes mutually adjacent aluminum lines separated from each other by a gap made wider than that for each of said other pixels.

10. The imaging device according to claim 7, wherein said aluminum lines are a line of a floating diffusion section and a ground line.

11. The imaging device according to claim 1, wherein said special pixel includes a read gate with a size made different from that for each of pixels other than said special pixel.

12. The imaging device according to claim 11, wherein said special pixel includes said read gate with said size made larger than that for each of said other pixels.

13. The imaging device according to claim 11, wherein said special pixel includes said read gate with said size made smaller than that for each of said other pixels.

14. The imaging device according to claim 1, wherein said special pixel has a floating-diffusion-section creation implant pattern made different from that for each of pixels other than said special pixel.

15. The imaging device according to claim 1, wherein said special pixel has an aperture with a size made different from that for each of pixels other than said special pixel.

16. The imaging device according to claim 15, wherein said special pixel has said aperture with said size made smaller than that for each of said other pixels.

17. The imaging device according to claim 15, wherein said special pixel has said aperture with said size made larger than that for each of said other pixels.

18. The imaging device according to claim 1, wherein said special pixel is a pixel located in the vicinity of a joint between masks used to form said imaging device.

19. An imaging apparatus comprising:
an imaging device including one special pixel with a configuration having a layout made different from the layout of the configuration of each pixel other than said special pixel,
wherein said special pixel comprises a metallic line provided at a location different from that for each of pixels other than said special pixel, and wherein said special pixel comprises mutually adjacent metallic lines separated from each other by a gap made wider than that for each of said other pixels.

20. An imaging device comprising:
at least one special pixel with a configuration having a layout made different from a layout of the configuration of each pixel other than said special pixel,
wherein said special pixel includes an aluminum line having a shape made different from an aluminum line of said each pixel other than said special pixel, and
wherein said special pixel includes said aluminum line made thicker than said aluminum line of said each pixel other than said special pixel.

21. An imaging device comprising:
at least one special pixel with a configuration having a layout made different from a layout of the configuration of each pixel other than said special pixel,
wherein said special pixel includes an aluminum line having a shape made different from an aluminum line of said each pixel other than said special pixel, and
wherein said special pixel includes said aluminum line made thinner than said aluminum line of said each pixel other than said special pixel.

* * * * *